United States Patent
Wang et al.

(10) Patent No.: US 8,612,907 B2
(45) Date of Patent: Dec. 17, 2013

(54) HIGH-SPEED SRAM

(71) Applicants: Li-Wen Wang, Taichung (TW); Jack Liu, Taipei (TW); Shao-Yu Chou, Chu Pei (TW)

(72) Inventors: Li-Wen Wang, Taichung (TW); Jack Liu, Taipei (TW); Shao-Yu Chou, Chu Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/622,419

(22) Filed: Sep. 19, 2012

(65) Prior Publication Data

US 2013/0019218 A1   Jan. 17, 2013

Related U.S. Application Data

(62) Division of application No. 12/712,590, filed on Feb. 25, 2010, now Pat. No. 8,296,698.

(51) Int. Cl.
*G06F 17/50* (2006.01)
*G06F 9/455* (2006.01)

(52) U.S. Cl.
USPC .......................... 716/106; 716/100

(58) Field of Classification Search
USPC .................................. 716/100, 106
See application file for complete search history.

(56) References Cited

U.S. PATENT DOCUMENTS

| | | | |
|---|---|---|---|
| 7,400,523 B2 | 7/2008 | Houston | |
| 7,539,963 B2 | 5/2009 | Ema et al. | |
| 7,926,018 B2 | 4/2011 | Moroz et al. | |
| 8,050,901 B2 | 11/2011 | Lin | |
| 2006/0146638 A1* | 7/2006 | Chang et al. | 365/230.05 |
| 2007/0033559 A1 | 2/2007 | Fulkerson | |
| 2008/0141190 A1 | 6/2008 | Jung et al. | |
| 2009/0055780 A1 | 2/2009 | Acar et al. | |
| 2009/0070716 A1 | 3/2009 | Joshi et al. | |
| 2009/0259453 A1* | 10/2009 | Wason et al. | 703/15 |
| 2009/0290439 A1* | 11/2009 | Chang et al. | 365/189.15 |
| 2009/0294861 A1* | 12/2009 | Thomas et al. | 257/368 |
| 2009/0323398 A1* | 12/2009 | Yabuuchi et al. | 365/148 |
| 2010/0169847 A1 | 7/2010 | Gupta et al. | |
| 2012/0185817 A1* | 7/2012 | Bansal et al. | 716/119 |

* cited by examiner

*Primary Examiner* — Stacy Whitmore
*Assistant Examiner* — Magid Dimyan
(74) *Attorney, Agent, or Firm* — Duane Morris LLP (57) ABSTRACT

A method includes a) receiving a design for a static random access memory (SRAM) array including an SRAM cell having a read port cell, the read port cell including first and second MOS transistors each having an initial threshold voltage (Vth); b) adjusting one of a gate channel width (Wg) or a gate channel length (Lg) of one of the first and second MOS transistors to modify the Vth of at least one of the first and second MOS transistors; c) simulating a response of the SRAM array, the simulation providing response data for the SRAM array including the Vth for the first and second MOS transistors; and d) iteratively repeating steps b) and c) until a desired Vth is achieved.

13 Claims, 8 Drawing Sheets

HIGH-SPEED SRAM

CROSS-REFERENCE TO RELATED APPLICATIONS

This application is a divisional of U.S. patent application Ser. No. 12/712,590, filed Feb. 25, 2010, the entirety of which is hereby incorporated by reference.

FIELD OF DISCLOSURE

The disclosed method relates to integrated circuits. More specifically, the disclosed method relates to static random access memory (SRAM) circuits formed on a semiconductor substrate.

BACKGROUND

Semiconductor memory devices are continually being designed to be made smaller, faster, and to require less power such that they may be incorporated in portable devices that run on battery power. SRAM is volatile memory widely used in laptop computers and personal digital assistants (PDAs) in which each memory cell includes a transistor-based bi-stable latch that is either in an 'on' state or in an 'off' state. SRAM devices may include a matrix of thousands of individual memory cells fabricated in an integrated circuit (IC) chip.

Figure 1A:
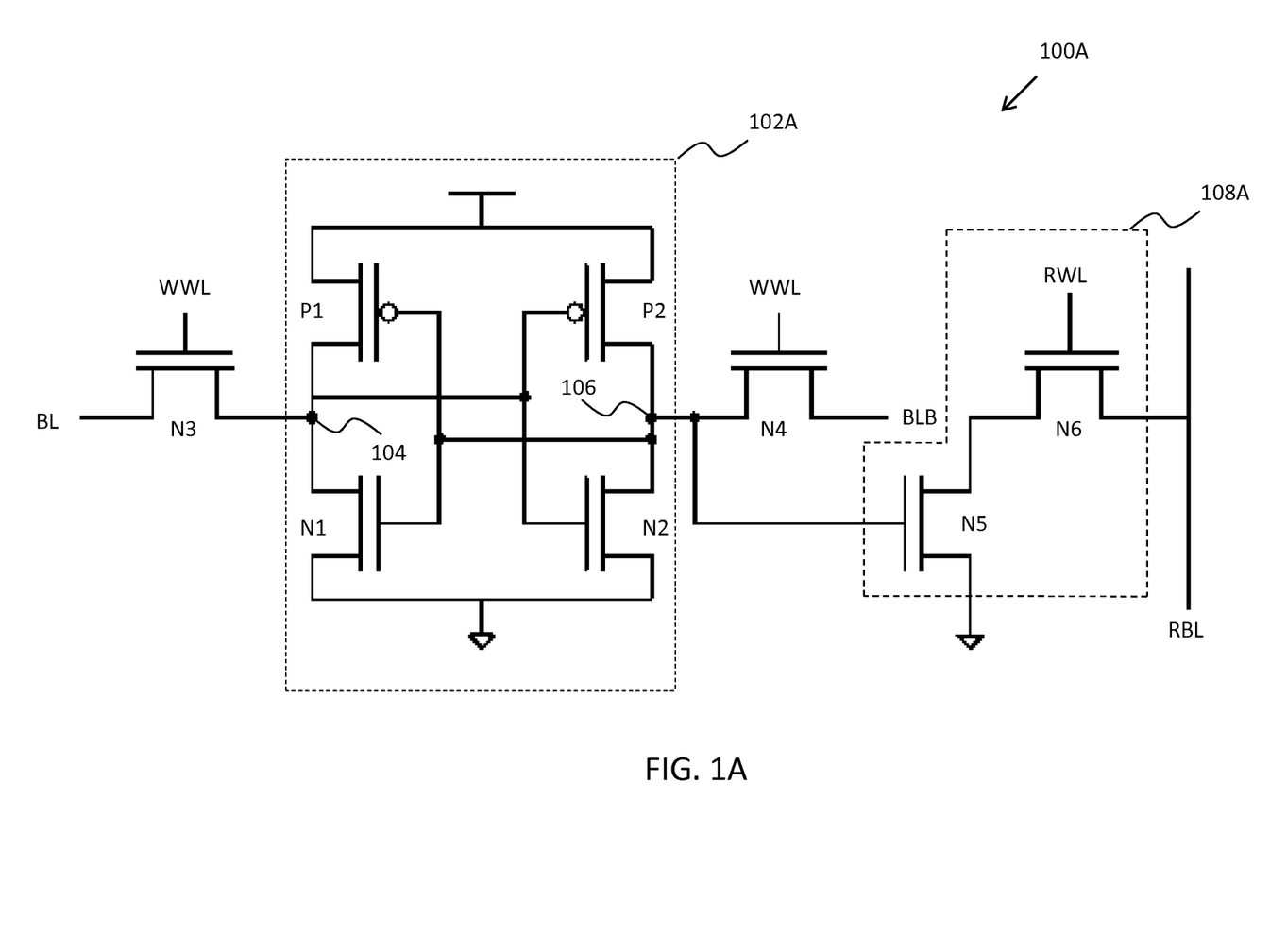
FIG. 1A is a schematic diagram of an eight transistor static random access memory (SRAM) cell.

FIG. 1A illustrates one example of an eight transistor (8T) SRAM cell 100A. The 8T SRAM cell 100A includes a cross-coupled inverter 102A including PMOS transistors P1, P2 and NMOS transistors N1, N2. NMOS transistor N3 is coupled to a bit line (BL) and to node 104 of inverter 102A. The gate of NMOS transistor N3 is coupled to a write word line (WWL). NMOS transistor N4 is coupled to inverter 102A at node 106 and to a bit line bar (BLB). The gate of NMOS transistor N4 is coupled to WWL. Read port transistor N5, which functions as a read pull-down (RPD) transistor, has its gate coupled to node 106 of inverter 102A, its source coupled to ground, and its drain coupled to read port transistor N6, which functions as a read pass gate (RPG) transistor. The gate of read port transistor N6 is coupled to a read word line (RWL), and the drain of the RPG transistor N6 is coupled to the read bit line (RBL).

Figure 1B:
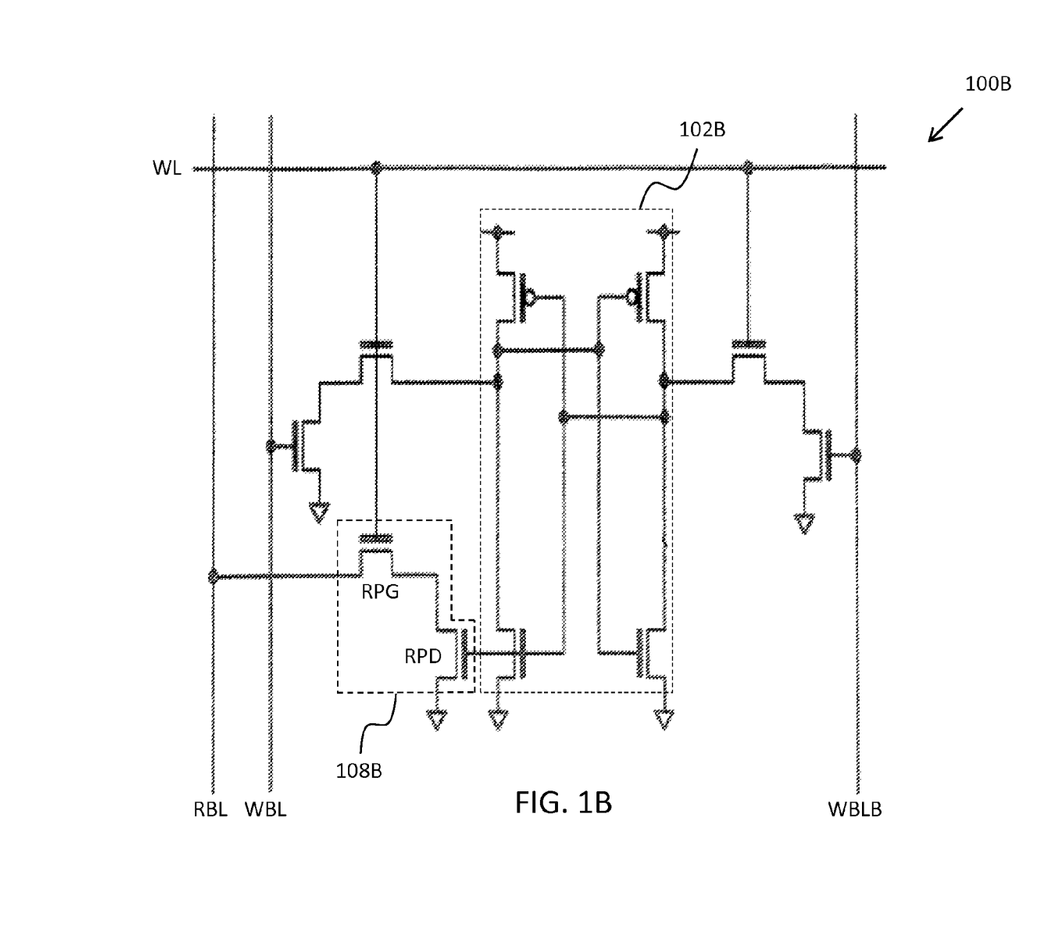
FIG. 1B is a schematic diagram of a ten transistor SRAM cell.
Figure 1C:
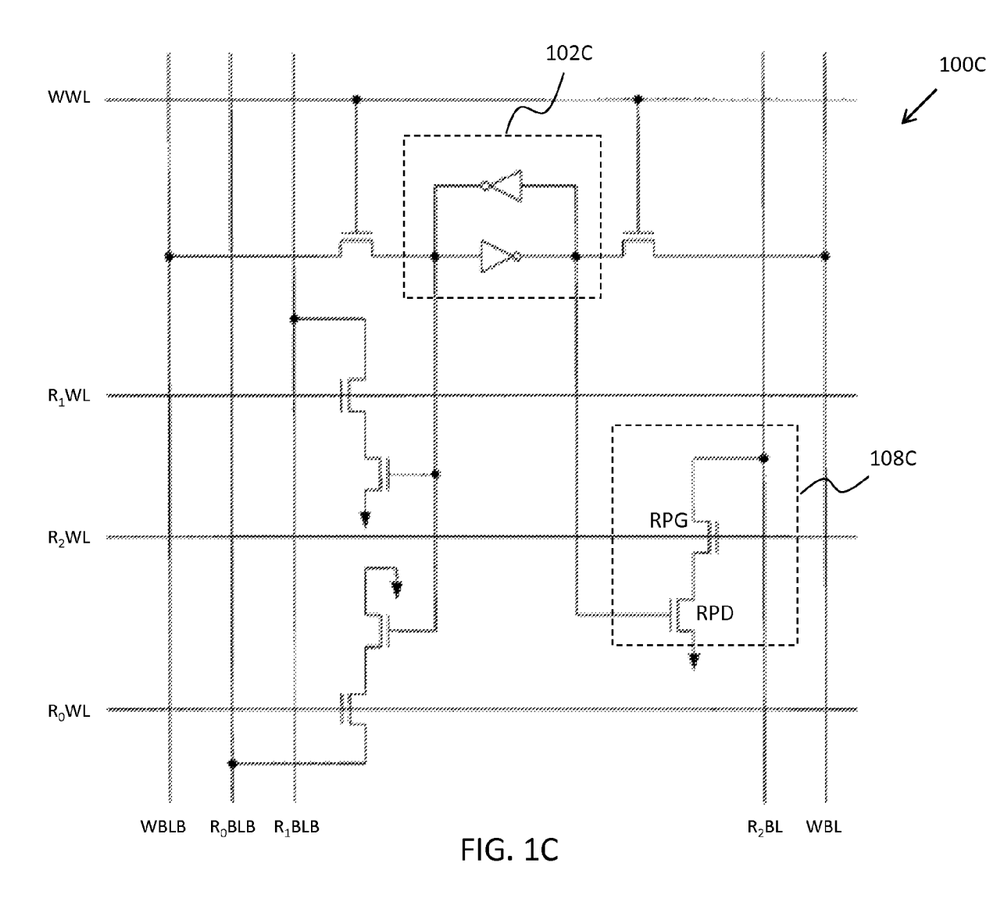
FIG. 1C is a schematic diagram of a twelve transistor SRAM cell.

FIGS. 1B and 1C respectively illustrate a ten transistor (10T) SRAM cell 100B and a twelve transistor (12T) SRAM cell 100C. Each of 10T and 12T SRAM cells 100B and 100C include inverters 102B and 102C as well as read port cells 108B and 108C. Each of the read port cells 108B, 108C include an RPD transistor and an RPG transistor.

Figure 2A:
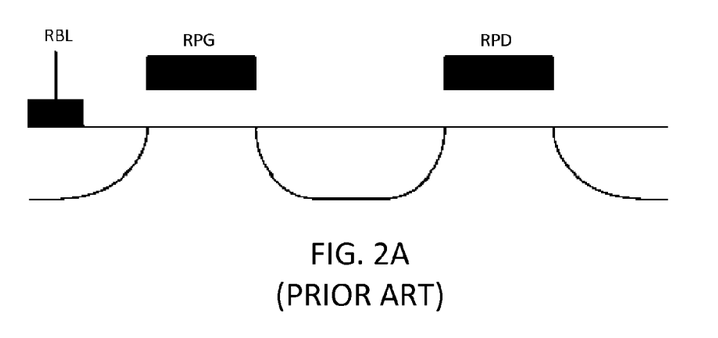
FIG. 2A is a cross-sectional view of the transistors of the read-port cell illustrated in FIG. 1.
Figure 2B:
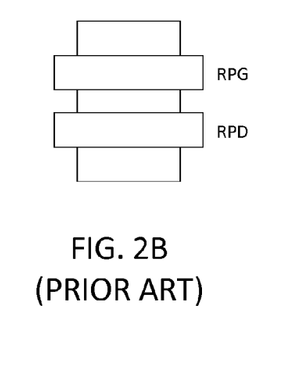
FIG. 2B is a plan view of the transistors of the read-port cell of the SRAM cell illustrated in FIGS. 1A-1C.
Figure 2C:
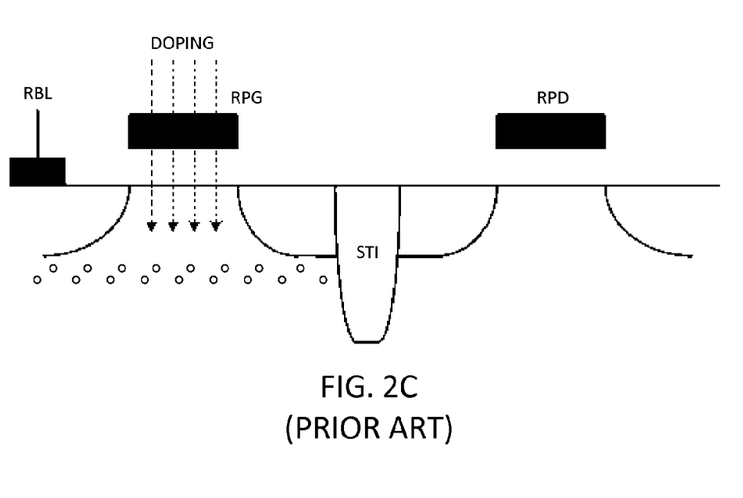
FIG. 2C is a cross-section view of a conventional method of increasing the threshold voltage ($V_{th}$) of one of the transistors in the read-port cell of the SRAM cell illustrated in FIGS. 1A-1C.
Figure 2D:
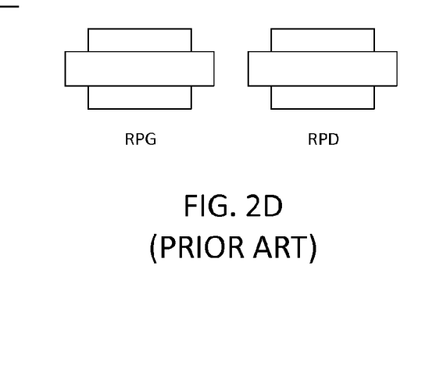
FIG. 2D is a plan view of a conventional method of increasing the $V_{th}$ of one of the transistors of the read-port cell of the SRAM cell illustrated in FIGS. 1A-1C.

In each of the SRAM cells 100A, 100B, and 100C, the threshold voltage ($V_{th}$) of the RPG transistor is typically increased to minimize the subthreshold leakage current in order to reduce the overall power consumption of the SRAM array. The conventional method of increasing the $V_{th}$ of the RPG transistor is by doping the channel of the RPG transistor. However, doping the channel of RPG transistor not only increases the number of processing steps for fabricating the SRAM, but it also results in an increase in the circuit footprint and the instability of the RPG transistor. For example, FIGS. 2A and 2B respectively illustrate cross-sectional and plan views of the RPG and RPD transistors in an SRAM cell, and FIGS. 2C and 2D respectively illustrate cross-sectional and plan views of the RPG and RPD transistors in an SRAM cell in which the $V_{th}$ of the RPG transistor is higher than the $V_{th}$ of the RPG transistor illustrated in FIGS. 2A and 2B. In order to isolate the channels of the RPG and RPD transistors, a shallow trench isolation (STI) structure is disposed between the drain of the RPD transistor and the source of the RPG transistor such that only the $V_{th}$ of the RPG transistor is increased. The addition of the STI structure increases the floor plan of the SRAM cell.

In high-speed applications such as register files (RFs) and L1-caches, the $V_{th}$ of a two read-port device is lowered in order to increase the operating speed of the devices. The reduced $V_{th}$ increases the read-port current to reduce the access time, but this results in a significant increase in the leakage current. Consequently, a tradeoff is typically made between reducing the leakage current and increasing the speed of the transistors of the SRAM circuit.

Accordingly, an improved system and method for reducing the leakage current of transistors in high-speed applications is desirable.

SUMMARY

A method is disclosed that includes a) receiving a design for a static random access memory (SRAM) array including an SRAM cell having a read port cell, the read port cell including first and second MOS transistors each having an initial threshold voltage ($V_{th}$); b) adjusting one of a gate channel width ($W_g$) or a gate channel length ($L_g$) of one of the first and second MOS transistors to modify the $V_{th}$ of at least one of the first and second MOS transistors; c) simulating a response of the SRAM array, the simulation providing response data for the SRAM array including the $V_{th}$ for the first and second MOS transistors; and d) iteratively repeating steps b) and c) until a desired $V_{th}$ is achieved.

An electronic design automation (EDA) system is also disclosed. The EDA system includes a computer readable storage medium and a processor in signal communication with the computer readable storage medium. The processor is configured to receive a design for a static random access memory (SRAM) array including an SRAM cell having a read port cell with first and second MOS transistors. The processor is configured to calculate an initial threshold voltage ($V_{th}$) for each of the first and second MOS transistors and receive a second design for the SRAM array. The second design includes an SRAM cell having a read port cell with the first MOS transistor and a third MOS transistor. The third MOS transistor has at least one of a gate channel width ($W_g$) dimension or a gate channel length dimension ($L_g$) that differs from a $W_g$ or an $L_g$ dimension of the second MOS transistor. The processor is configured to simulate a response of the second design for the SRAM array and generate a data file representing a physical layout of the SRAM array on a semiconductor wafer.

DETAILED DESCRIPTION

A method of increasing the threshold voltage ($V_{th}$) of the transistors of a read port cell of an SRAM circuit is disclosed to provide a decrease in subthreshold leakage while maintaining a high-operating speed in a small footprint. The method includes separately adjusting the $V_{th}$ of the read-port cell by varying the gate-channel length ($L_g$) and/or the gate-channel width ($W_g$) while maintaining the dimensions of the other transistors in the SRAM array.

Figure 3:
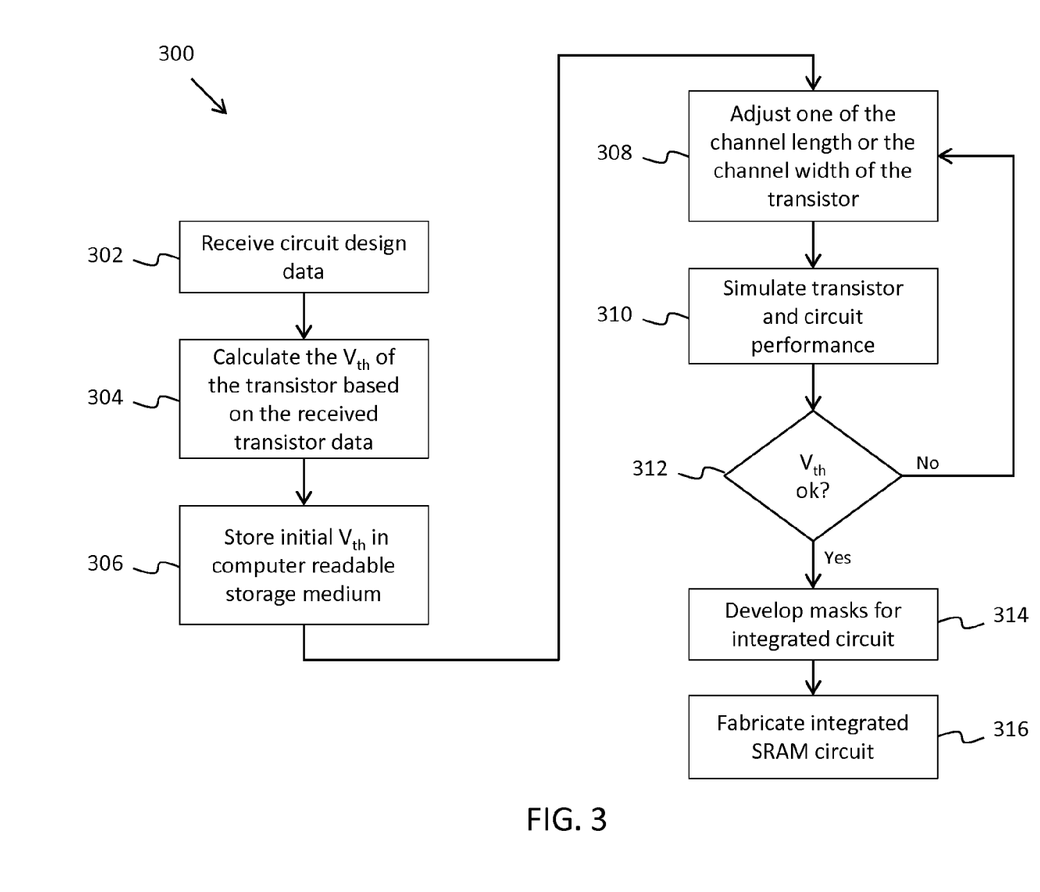
FIG. 3 is a flow diagram of one example of a method of increasing the $V_{th}$ of the read-port cell in high-speed SRAM.

FIG. 3 is a flow diagram of one example of a method for increasing the threshold voltage of transistors in high-speed SRAM applications. At block 302, a circuit design for an SRAM array is received. The circuit design includes transistor data for the transistors of the SRAM array. The transistor data may include values for a channel width, channel length, and oxide thickness of the transistors to name a few.

At block 304, the $V_{th}$ of each of the read port transistors is calculated based on the received transistor data. As will be understood by one skilled in the art, the $V_{th}$ of the transistor may be based on a variety of characteristics of the transistor such as, for example, the oxide thickness, the permittivity of the silicon, and the gate channel width ($W_g$) and length ($L_g$). Equations 1 and 2 below show the relationship between $V_{th}$ and the $W_g$ and $L_g$ of a transistor.

$$\Delta V_{TH\_W_g} = \beta_3 \pi \frac{\varepsilon_s}{\varepsilon_{ox}} \frac{t_{ox}}{W_g}(\phi_0 + V_{SB}) \quad \text{Eq. 1}$$

$$\Delta V_{TH\_L_g} = -2\beta_1 \frac{\varepsilon_s}{\varepsilon_{ox}} \frac{t_{ox}}{L_g}[(\phi_0 + V_{SB}) + \beta_2 V_{DS}] \quad \text{Eq. 2}$$

Where,
$t_{ox}$ is the oxide thickness;
$\epsilon_{ox}$ is the permittivity of the oxide;
$\epsilon_s$ is the permittivity of silicon;
$V_{SB}$ is the source-base voltage of the transistor;
$\phi_0$ is the surface potential; and
$\beta_{1,2,\text{ and } 3}$ are process dependent constants.

Figure 4A:
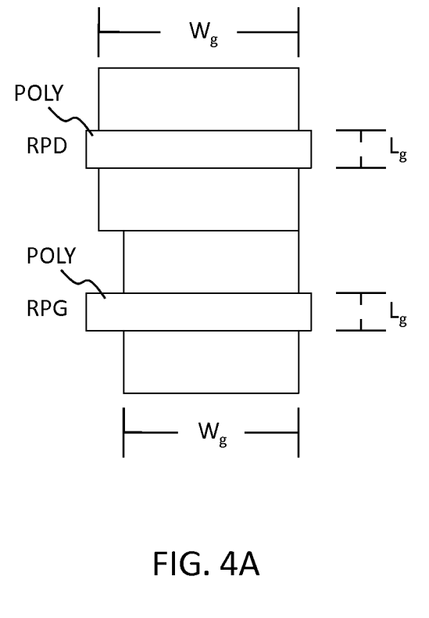
FIG. 4A is a plan view of the transistors of a read port cell in an original layout.
Figure 4B:
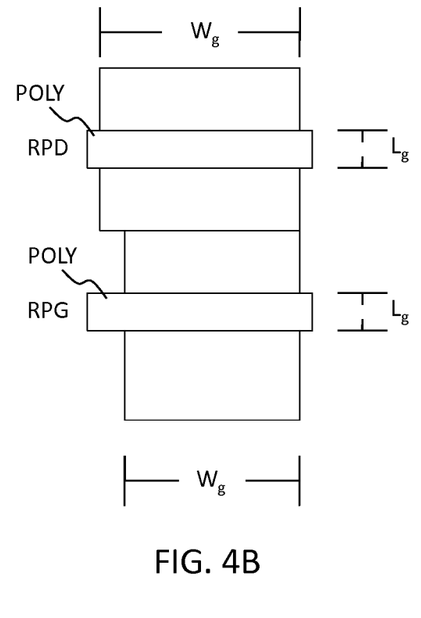
FIG. 4B is a plan view of the transistors of the read port cell in accordance with FIG. 4A with the $V_{th}$ of one of the transistors having been adjusted in accordance with the improved method.
Figure 4C:
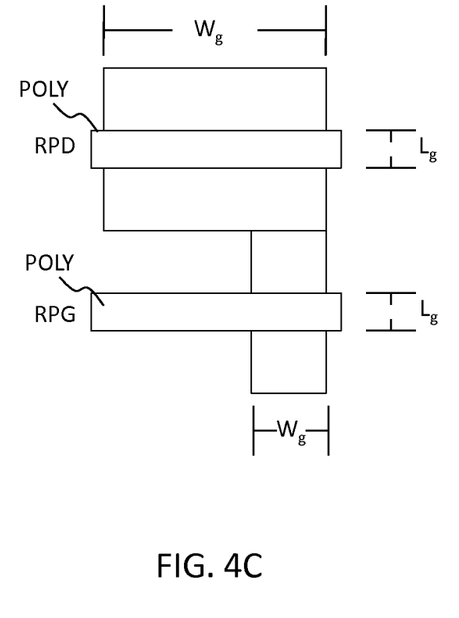
FIG. 4C is a plan view of the transistors of the read port cell in accordance with FIG. 4A with the $V_{th}$ of one of the transistors having been adjusted in accordance with an improved method.

The calculated $V_{th}$ of the read port transistors may be stored in a computer readable storage medium at block 306. At block 308, at least one of $W_g$ or $L_g$ of one of the transistors of the read port cell is adjusted (e.g., increased or decreased) to adjust the $V_{th}$ of the transistor. For example, FIG. 4A is a plan view of an initial layout of the RPG and RPD transistors of a read port cell 108A-108C of an SRAM cell 100A-100C in which the RPD transistor has a $W_g$ of approximately 215 nm and an $L_g$ of approximately 30 nm, and the RPG transistor has a $W_g$ of approximately 200 nm and an $L_g$ of approximately 32 nm. FIG. 4B illustrates a plan view of the RPG and RPD transistors of a read port cell 108A-108C in which the $L_g$ of the RPG transistor has been increased from 32 nm to 53 nm to increase the $V_{th}$ of the RPG transistor. FIG. 4C is a plan view of the RPG and RPD transistors of a read port cell 108A-108C in which the $W_g$ of the RPG transistor is decreased from 200 nm to 8 nm to increase the $V_{th}$ of the RPG transistor. One skilled in the art will understand that the $W_g$ and $L_g$ of the RPD transistors may be adjusted to have other dimensions depending on the operating conditions of the SRAM cell 100. Additionally, $W_g$ and $L_g$ of the RPD transistors may also be adjusted to increase the $V_{th}$ of the RPD transistors. The $W_g$ and $L_g$ of both the RPG and RPD transistors may be simultaneously adjusted to achieve the desired $V_{th}$ of the transistors as will be understood by one skilled in the art.

Figure 6:
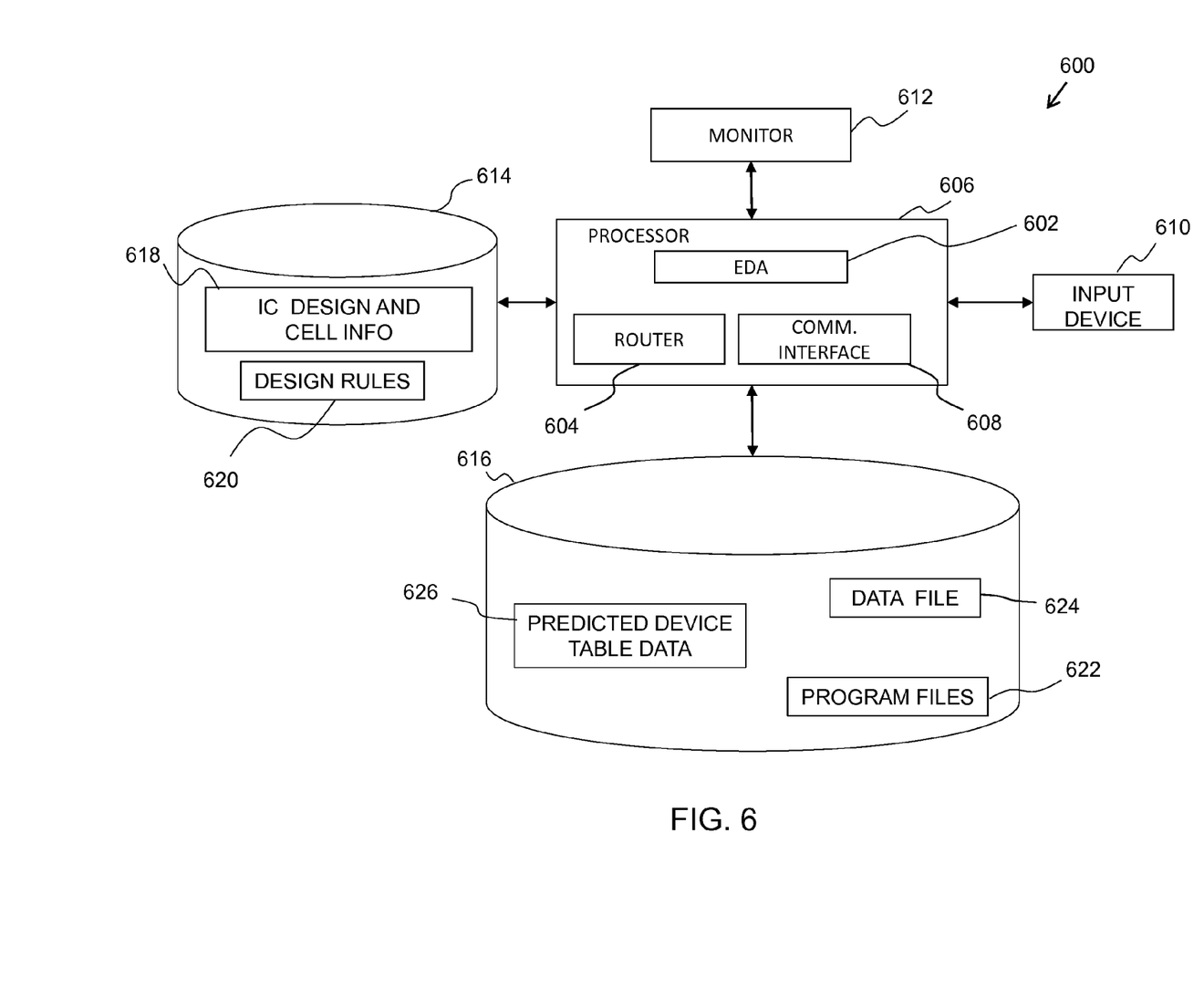
FIG. 6 is a block diagram of a system for performing the method illustrated in FIG. 3.

At block 310, a simulation is performed for an SRAM array including SRAM cells 100A-100C having read port cells 108A-108C with at least one of the RPG transistor or the RPD transistor having a dimension of at least one of $W_g$ or $L_g$ being different from its initial dimension. The dimensions of the other transistors in the SRAM array are maintained. The simulation may be performed using a simulation program with integrated circuit emphasis (SPICE) that may be run on a system 600 as illustrated in FIG. 6. As shown in FIG. 6, the system 600 may include an electronic design automation tool 602 such as "IC COMPILER"™, sold by Synopsis, Inc. of Mountain View, Calif., having a router 604 such as "ZROUTE"™, also sold by Synopsis. Other EDA tools 602 may be used, such as, for example, the "VIRTUOSO" custom design platform or the Cadence "ENCOUNTER"® digital IC design platform along with the "VIRTUOSO" chip assembly router 604, all sold by Cadence Design Systems, Inc. of San Jose, Calif.

The EDA tool 602 is a special purpose computer formed by retrieving stored program instructions 622 from a computer readable storage mediums 614, 616 and executing the instructions on a general purpose processor 606. Processor 606 may be any central processing unit (CPU), microprocessor, microcontroller, or computational device or circuit for executing instructions. Processor 606 may be configured to perform circuit simulations based on a plurality of data stored in the one or more computer readable storage mediums 614, 616.

The computer readable storage medium 614, 616 may include one or more of registers, a random access memory (RAM) and/or a more persistent memory, such as a ROM. Examples of RAM include, but are not limited to, SRAM or dynamic random-access memory (DRAM). A ROM may be implemented as a programmable read-only memory (PROM), an erasable programmable read-only memory (EPROM), an electrically erasable programmable read-only memory (EEPROM), magnetic or optical storage media, as will be understood by one skilled in the art.

System 600 may include a monitor 610 and a user interface or input device 612 such as, for example, a mouse, a touch screen, a microphone, a trackball, a keyboard, or like device through which a user may input design instructions and/or data. The one or more computer readable storage mediums 614, 616 may store data input by a user, design rules 620, IC design and cell information 618, and data files 626, such as GDSII files, representing a physical layout of a circuit. Computer readable storage mediums 614, 616 may also store various transistor models in a variety of formats including, but not limited to, BSIM3, BSIM4, PSP, and HiSIM to name a few.

EDA tool 602 may include a communication interface 608 allowing software and data to be transferred between EDA tool 602 and external devices. Example communications interfaces 608 include, but are not limited to, modems, Ethernet cards, wireless network cards, Personal Computer Memory Card International Association (PCMCIA) slots and cards, or the like. Software and data transferred via communications interface 608 may be in the form of signals, which may be electronic, electromagnetic, optical, or the like that are capable of being received by communications interface 608. These signals may be provided to communications interface 108 via a communication path (e.g., channel), which may be implemented using wire, cable, fiber optics, a telephone line, a cellular link, a radio frequency (RF) link, to name a few.

The router 604 is capable of receiving an identification of a plurality of circuit components to be included in an integrated circuit (IC) layout including a list of pairs of cells, macro blocks or I/O pads within the plurality of circuit components to be connected to each other. A set of design rules 620 may be used for a variety of technology nodes (e.g., technology greater than, less than, or equal to 32 nm). In some embodiments, the design rules 620 configure the router 604 to locate connecting lines and vias on a manufacturing grid.

One or more plots of data may be displayed to a user of the system 600 on a monitor 612. The plots may provide the user with a graphical representation of various circuit and device parameters including, but not limited to, the $V_{th}$ of the RPG and RPD transistors, the operating frequency of the RPG and RPD transistors, the operating frequency of the SRAM cell 100A-100C, and the leakage current to name a few.

At decision block 312, a determination is made as to whether the desired $V_{th}$ for the read cell transistor(s) having the adjusted $W_g$ and/or $L_g$ has been achieved. The determination may be based on $V_{th}$ as well as the operating frequency of the RPG and RPD transistors. If the $V_{th}$ value is not acceptable, then the method proceeds to block 308 and the $W_g$ and/or $L_g$ of one or more of the RPG and RPD transistors may be adjusted as described above. If the $V_{th}$ value is acceptable, then the method may proceed to block 314. One of ordinary skill in the art will appreciate that the loop including steps 308, 310 and 312 may be executed any number of times, until a desired predetermined $V_{th}$ is achieved. This iteration can be performed by a computer repeatedly determining the value of $V_{th}$ for a plurality of different transistor adjustments, so that an acceptable transistor can be achieved on a first iteration on actual silicon.

At block 314, the masks for the SRAM array including the SRAM cells 100 having the read port cells 108A-108C with the desired $V_{th}$ are developed. The SRAM array may then be fabricated at block 316.

In other examples, following generation of a mask set and fabrication of a substrate including the tuned transistor, additional adjustments can be made using the method of FIG. 3, by inputting the design used in silicon as the input design in FIG. 3.

The method 300 for adjusting the $V_{th}$ for the transistors of a read port cell 108A-108C in an SRAM cell 100A-100C described above advantageously enables the leakage current to be minimized while maintaining a high operating frequency and without dramatically increasing the footprint compared to the channel doping as conventionally performed to increase the $V_{th}$. The improved method described above also enables independent or simultaneous adjustment the $V_{th}$ of the transistors of the read port cell while the dimensions for the other transistors of the SRAM array for the particular technology node for which the SRAM array is being designed may be maintained. Additionally, adjusting the $V_{th}$ of the transistors of the read port cell by adjusting at least one of the $L_g$ or $W_g$ of one of the RPG or RPD transistors reduces the variation of the Vth, which is approximately proportional to square root of the quotient of the dopant concentration divided by the product of the $L_g$ and $W_g$. Accordingly, adjusting the $V_{th}$ of at least one of the RPG and RPD transistors as described above will have a more consistent operation compared to a transistor having its $V_{th}$ increased through the conventional method of doping the channel.

Table 1 below lists the $V_{th}$ for the RPG and RPD transistors, total circuit delay for an SRAM array, and the current leakage for the SRAM cell for an initial design, the conventional doping method of adjusting the $V_{th}$ of the read port transistors, and the improved method of adjusting the $V_{th}$ of the read port transistors.

TABLE 1

| | Initial Design | Conventional Doping Method | Improved Method |
|---|---|---|---|
| Read-Port Cell | $\Delta V_{thRPG}$ = 0 mV<br>$\Delta V_{thRPD}$ = 0 mV | $\Delta V_{thRPG}$ = 20 mV<br>$\Delta V_{thRPD}$ = 20 mV | $\Delta V_{thRPG}$ = 20 mV<br>$\Delta V_{thRPD}$ = 0 mV |
| Total Circuit Delay | 80 ps | 85 ps | 81.5 ps |
| Current Leakage | 146.75 nA | 93.47 nA | 93.49 nA |

Figure 5:
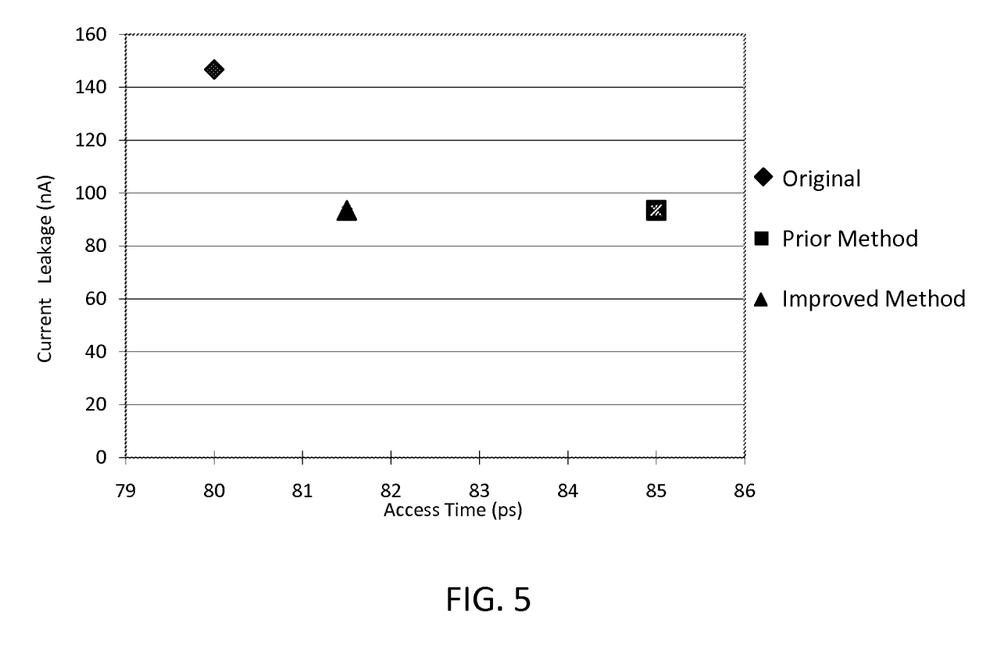
FIG. 5 is a graph showing current leakage versus access time for read port cells having various threshold voltages.

As shown in Table 1, the improved method provides only a slight degradation in circuit delay (e.g., approximately two percent) compared to the conventional doping method, which experiences a delay of approximately six percent. Further, the method described above provides a current leakage that is almost identical to the reduced current leakage experienced by the conventional doping method. FIG. 5 is a graphical representation of the data in Table 1.

The present invention may be embodied in the form of computer-implemented processes and apparatus for practicing those processes. The present invention may also be embodied in the form of computer program code embodied in tangible machine readable storage media, such as random access memory (RAM), floppy diskettes, read only memories (ROMs), CD-ROMs, hard disk drives, flash memories, or any other machine-readable storage medium, wherein, when the computer program code is loaded into and executed by a computer, the computer becomes an apparatus for practicing the invention. The present invention may also be embodied in the form of computer program code loaded into and/or executed by a computer, such that, when the computer program code is loaded into and executed by a computer, the computer becomes an apparatus for practicing the invention. When implemented on a general-purpose processor, the computer program code segments configure the processor to create specific logic circuits. The invention may alternatively be embodied in a digital signal processor formed of application specific integrated circuits for performing a method according to the principles of the invention.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention. Delimiters used in the claims—such as 'a)' and 'i)'—should not be taken as imputing any order to the claims, but rather are provided only to serve as visual cues to add in the parsing of the claims and as identifiers in the event that a particular portion of the claim is to be later referenced.

What is claimed is:

1. An electronic design automation (EDA) system, comprising:
   a computer readable storage medium; and
   a processor in signal communication with the computer readable storage medium, the processor configured to:
      receive a first design for a static random access memory (SRAM) array including an SRAM cell having a read port cell, the read port cell including first and second MOS transistors,
      calculate a threshold voltage ($V_{th}$) for each of the first and second MOS transistors in the first design of the SRAM array,
      calculate a threshold voltage ($V_{th}$) for a third MOS transistor of a second design of an SRAM array, the second design including an SRAM cell having a read port cell including the first MOS transistor and the third MOS transistor, the third MOS transistor having at least one of a gate channel width ($W_g$) dimension or a gate channel length dimension ($L_g$) that differs from a $W_g$ or an $L_g$ dimension of the second MOS transistor, wherein the other dimensions of the other transistors in the second design of the SRAM array are the same as the dimensions in the first design of the SRAM array,
      simulate a response of the second design for the SRAM array if the threshold voltage of the third MOS transistor is above a threshold level, and
      generate a data file representing a physical layout of the SRAM array on a semiconductor wafer.

2. The EDA system of claim 1, wherein the data file is a GDSII file, and the processor is configured to store the GDSII file in the computer readable storage medium.

3. The EDA system of claim 1, wherein the $W_g$ of the third MOS transistor is narrower than the $W_g$ of the second MOS transistors.

4. The EDA system of claim 1, wherein the $L_g$ of the third MOS transistor is longer than the $L_g$ of the second MOS transistor.

5. The EDA system of claim 1, wherein the first MOS transistor of the read port cell is an NMOS transistor having a source coupled to ground, a gate coupled to an output of a cross-coupled CMOS inverter, and a drain coupled to a source of the second MOS transistor, the second MOS transistor being an NMOS transistor having a gate coupled to a read word line and a drain coupled to a read bit line.

6. The EDA system of claim 1, wherein the first MOS transistor of the read port cell is an NMOS transistor having a source coupled to ground, a gate coupled to an output of a cross-coupled CMOS inverter, and a drain coupled to a source of the third MOS transistor, the third MOS transistor being an NMOS transistor having a gate coupled to a read word line and a drain coupled to a read bit line.

7. The EDA system of claim 1, wherein the second design for the SRAM array includes an SRAM cell having a read port cell including the third MOS transistor and a fourth MOS transistor, the third MOS transistor having at least one of the $W_g$ dimension or the $L_g$ dimension that differs from the $W_g$ or the $L_g$ dimension of the second MOS transistor, the fourth MOS transistor having at least one of the $W_g$ dimension or the $L_g$ dimension that differs from the $W_g$ dimension or the $L_g$ dimension of the first MOS transistor.

8. An electronic design automation (EDA) system, comprising:
   a computer readable storage medium; and
   a processor in signal communication with the computer readable storage medium, the processor configured to:
      receive a first design for a static random access memory (SRAM) array including an SRAM cell having a read port cell, the read port cell including first and second MOS transistors,
      calculate threshold voltage ($V_{th}$) for each of the first and second MOS transistors,
      calculate a threshold voltage ($V_{th}$) for a third MOS transistor of a second design of an SRAM array, the second design including an SRAM cell having a read port cell including the first MOS transistor and the third MOS transistor, the third MOS transistor having at least one of a gate channel width ($W_g$) dimension or a gate channel length dimension ($L_g$) that differs from a $W_g$ or an $L_g$ dimension of the second MOS transistor, wherein the other dimensions of the other transistors in the second design of the SRAM array are the same as the dimensions in the first design of the SRAM array,
      simulate a response of the second design for the SRAM array if the threshold voltage of the third MOS transistor is above a threshold level, and
      generate a GDSII data file representing a physical layout of the second design of the SRAM array on a semiconductor wafer.

9. The EDA system of claim 8, and the processor is configured to store the GDSII data file in the computer readable storage medium.

10. The EDA system of claim 8, wherein the $W_g$ of the third MOS transistor is narrower than the $W_g$ of the second MOS transistors.

11. The EDA system of claim 8, wherein the $L_g$ of the third MOS transistor is longer than the $L_g$ of the second MOS transistor.

12. The EDA system of claim 8, wherein the first MOS transistor of the read port cell is an NMOS transistor having a source coupled to ground, a gate coupled to an output of a cross-coupled CMOS inverter, and a drain coupled to a source of the second MOS transistor, the second MOS transistor being an NMOS transistor having a gate coupled to a read word line and a drain coupled to a read bit line.

13. The EDA system of claim 8, wherein the first MOS transistor of the read port cell is an NMOS transistor having a source coupled to ground, a gate coupled to an output of a cross-coupled CMOS inverter, and a drain coupled to a source of the third MOS transistor, the third MOS transistor being an NMOS transistor having a gate coupled to a read word line and a drain coupled to a read bit line.

* * * * *